United States Patent [19]
Todd et al.

[11] Patent Number: 5,639,010
[45] Date of Patent: Jun. 17, 1997

[54] SIMULTANEOUS PROCESS FOR SURFACE MOUNT ADHESIVE CURE AND SOLDER PASTE REFLOW FOR SURFACE MOUNT TECHNOLOGY DEVICES

[75] Inventors: Michael G. Todd, South Lyon; Mayank R. Parikh, Canton, both of Mich.; Jorge D. Santana; Mauricio Ciocler, both of Sao Paulo, Brazil

[73] Assignee: Ford Motor Company, Dearborn, Mich.

[21] Appl. No.: 521,765

[22] Filed: Aug. 31, 1995

[51] Int. Cl.⁶ ............................................. H05K 3/34
[52] U.S. Cl. ............................ 228/175; 228/233.2
[58] Field of Search ......................... 228/175, 180.1, 228/180.21, 212, 224, 233.2

[56] References Cited

U.S. PATENT DOCUMENTS

| | | | |
|---|---|---|---|
| 4,172,547 | 10/1979 | DelGrande | 228/121 |
| 4,208,005 | 6/1980 | Nate et al. | 228/175 |
| 4,314,870 | 2/1982 | Ishida et al. | 228/175 |
| 4,398,660 | 8/1983 | Pampalone et al. | 228/175 |
| 4,515,304 | 5/1985 | Berger | 228/180.1 |
| 4,573,105 | 2/1986 | Beldavs | 361/403 |
| 4,752,027 | 6/1988 | Gschwend | 228/234.2 |
| 4,761,881 | 8/1988 | Bora et al. | 228/180.1 |
| 4,771,929 | 9/1988 | Bahr et al. | 228/102 |
| 4,998,342 | 3/1991 | Bonnell et al. | 29/840 |
| 5,155,904 | 10/1992 | Majd | 228/180.1 |

Primary Examiner—Samuel M. Heinrich
Attorney, Agent, or Firm—Joseph W. Malleck

[57] ABSTRACT

A method for attaching a surface mount device to a circuit board includes applying a heat curable adhesive to the circuit board, applying solder paste with a predetermined melting temperature to the circuit board, placing the surface mount device on the adhesive, placing the circuit board into an oven where the circuit board is continuously heated to a first temperature until the adhesive is sufficiently cured so that it withstands reflow of the solder paste then to a second temperature to melt the solder paste.

5 Claims, 2 Drawing Sheets

Surface Mount Adhesive Cure Analysis
Differential Scanning Calorimetry Results:
% Cure As A Function Of Time At 150°C

| Cure Time At 150°C | DSC Cure Exotherm | Calculated % Cure |
|---|---|---|
| 0 Seconds | 284.3 J/g | 0 |
| 30 Seconds | 35.21 J/g | 90.84 |
| 60 Seconds | 30.72 J/g | 92.01 |
| 90 Seconds | 14.34 J/g | 96.27 |
| 120 Seconds | 12.94 J/g | 96.63 |
| 300 Seconds | 0 J/g | 100 |

FIG. 4.

Surface Mount Adhesive Cure Analysis
Torque Measurements As A Function Of
Adhesive Cure Time
(Adapted From Manufacturer Report)

| Cure Time | At 100°C | At 150°C |
|---|---|---|
| 60 Seconds | 9 N mm | 57 N mm |
| 90 Seconds | 16 N mm | 56 N mm |
| 120 Seconds | 26 N mm | 53 N mm |
| 180 Seconds | 26 N mm | 56 N mm |
| 600 Seconds | 56 N mm | --- |

FIG. 5.

SIMULTANEOUS PROCESS FOR SURFACE MOUNT ADHESIVE CURE AND SOLDER PASTE REFLOW FOR SURFACE MOUNT TECHNOLOGY DEVICES

BACKGROUND OF THE INVENTION

The present invention relates generally to mounting surface mount devices (SMD). More specifically, the invention relates to curing a mounting adhesive and reflow soldering of SMD's using minimal processing time and equipment.

Surface mount device technology usage has become more prevalent in the electronics industry, especially in view of the ever-increasing need for smaller modules. SMDs have two or more solder pads on either end of the device. To mount the SMD to a circuit board, solder paste is dispensed on solder pads of the circuit board. Dispensing typically is accomplished by screen printing or stencil printing. Then the solder pads of the SMD are stacked on the screen-printed solder paste. The solder paste is then heated to reflow the solder to a molten state so that the solder pads on the SMD and on the circuit board are joined when the solder resolidifies upon cooling. However, during the reflow of the solder, significant forces act upon the SMD causing the SMD to move. This is especially true for small SMDs.

To remedy component movement, various adhesives are used to secure the SMD to the circuit board prior to and during the reflow process. One disadvantage in using adhesives is that they typically require substantial time to cure so that the SMD is securely held in place. One type of adhesive is thermally-cured adhesive, which typically requires up to 15 minutes in a curing oven to fully cure. Other types of adhesive may be cured using ultraviolet radiation, which also requires a significant amount of time to cure, as well as requiring specialized equipment.

Once the adhesive is cured the circuit board is cooled. The circuit board with the attached SMD is then placed in a reflow oven, and the solder is heated to its molten state to wet the contacts of the solder pads of the SMD and the solder pads of the circuit board. While the SMD is in the reflow oven, the circuit board assembly is first heated to a temperature to activate the flux present within the solder paste. Then, the assembly is heated to a second, higher temperature after the flux has been activated to reflow the solder for a predetermined amount of time.

One drawback to the use of adhesives has been that a station separate from that required to provide heating reflow is required to either provide thermal curing or ultraviolet curing. Since it is also desirable to process the circuit board with the SMD in a continuous manufacturing assembly process, eliminating extra time consuming steps and equipment is highly advantageous.

Another drawback to the use of the adhesive curing process is that the solder joints are less reliable. Since solder is typically dispensed before curing, during curing the solvents and activators within the solder paste are either changed or evaporated. Consequently, when the solder is reflowed the properties of the solder paste are typically affected.

A disadvantage of processing small SMDs is that the board geometry is highly susceptible to arc-over and electromigration. These situations occur when electrostatic charge differential is built up between two adjacent solder pads and is released. Arc-over occurs from a sudden burst of electrical energy. Electromigration is when the charge is slowly conducted over the surface of the circuit board between the two solder pads as a result of ionic contamination and biased potential.

SUMMARY OF THE INVENTION

One advantage of the present invention is that circuit boards manufactured with this process employing relatively small components with surface mount adhesive between the solder pads have a natural arc-over and electromigration barrier. As a result electrical reliability is higher and components are able to be placed closer together.

The present invention includes applying a heat curable adhesive to a circuit board, applying a solder paste having a predetermined melting temperature to the circuit board, placing an SMD on the adhesive and solder paste, and placing the circuit board into an oven where the circuit board is heated to a first temperature until the adhesive is sufficiently cured to withstand reflow of the solder paste and the flux in the solder paste is activated and then continuously to a second temperature to reflow the solder.

BRIEF DESCRIPTION OF THE DRAWINGS

FIG. 4 is a surface mount adhesive cure analysis according to a differential scanning calorimeter.

FIG. 5 is a surface mount adhesive cure analysis showing the torque required to cause adhesive bond failure as a function of time of cure of the adhesive.

DETAILED DESCRIPTION OF THE PREFERRED EMBODIMENT

Figure 1:
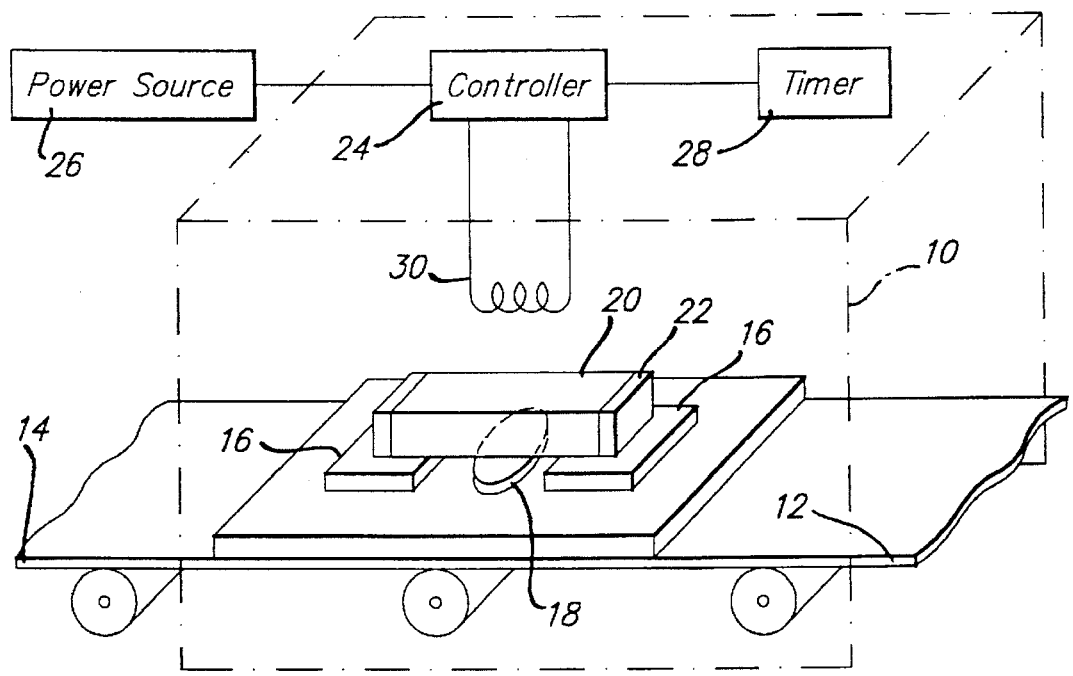
FIG. 1 is a diagrammatic view of an apparatus to perform the process of the present invention.

Referring now to FIG. 1, an oven 10 is shown as part of a circuit board assembly process. A circuit board 12, which is to be processed, is placed on conveyor belt 14, passes through several processing steps and then enters oven 10. Circuit board 12 is shown having a pair of solder pads 16, an adhesive patch 18, and a surface mount device (SMD) 20. For simplicity, circuit board 12 is shown having only one component. SMD 20 has a pair of solder pads 22 covering opposite ends.

Oven 10 is preferably a reflow oven of the kind commonly used in reflow soldering. A controller 24 is used to control the operation of oven 10. Controller 24 is connected to a power source 26, a timer 28, and a heating element 30. Controller 24 controls the connection of power source 26 to heating element 30 based on the required processing time and temperature as enumerated by timer 28 for the surface mount device. Heating element 30 may be several heating elements for areas.

The adhesive may be a variety of materials including epoxies, phenolics urethanes, silicones, acrylates, and polyamides. One example of an acceptable adhesive is Loctite brand, Chipbonder 3609®, which is an epoxy-based amine-cured epoxy. Another alternative adhesive is an epoxy using an anhydride curing agent with an imidazole catalyst. The anhydride curing agent is preferably an aromatic anhydride curing agent.

Figure 2:
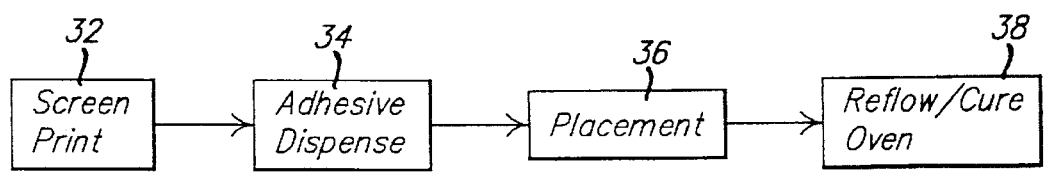
FIG. 2 is a flow chart of the process of the present invention.

Referring now to FIG. 2, the process for securing a surface mount device is shown according to the present invention. In Step 32, a circuit board is screen-printed or stencil printed with solder paste in a conventional manner. The solder paste is applied through a squeegee process so that the solder remains on the solder pads of the circuit board once the board is printed. The solder paste that is dispensed on the circuit board in Step 32 preferably contains a mixture of flux, some solvents, and a tin/lead alloy. Solder typically has a melting temperature of between 179° C.–189° C. Flux has a somewhat lower activation temperature typically between 100° C.–170° C. However, the process may be used with alloys of other compositions and without solvents.

In Step 34, an adhesive is dispensed on the circuit board in the areas where a surface mount device will later be affixed. Typically a drop of adhesive is dispensed via automated equipment between two solder pads on the circuit board.

In Step 36, the surface mount devices are placed on the solder pads and adhesive. In prior processes, once the surface mount device is placed on the adhesive, the adhesive had to be cured before any further processing. This typically required ultraviolet radiation or a separate oven performing a curing process.

In Step 38, the circuit board with the surface mount device mounted on it is placed in an oven for continually performing both curing of adhesive and reflow of solder.

Figure 3:
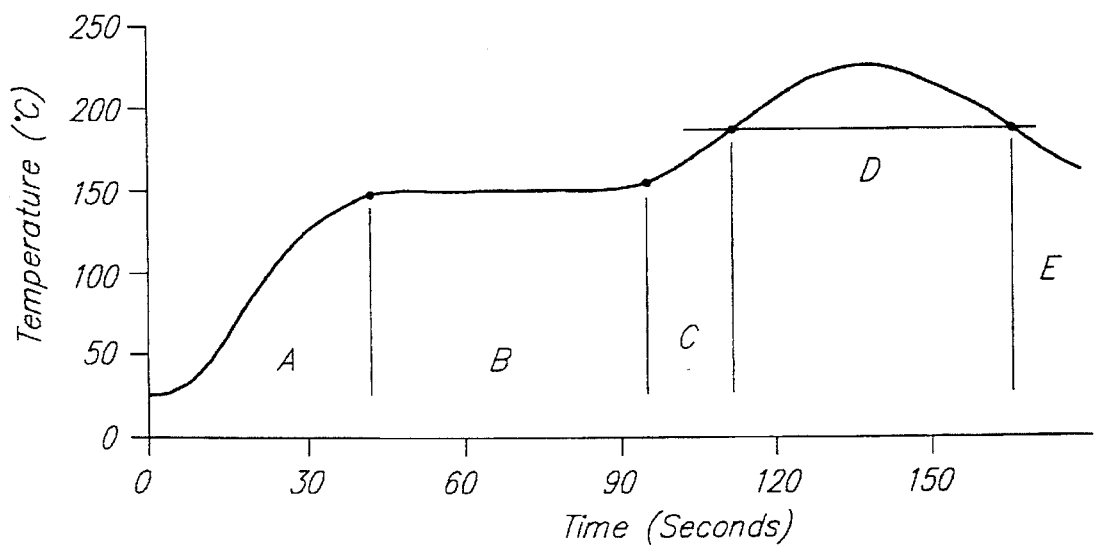
FIG. 3 is a temperature profile utilized in an oven according to the present invention.

Referring now to FIG. 3, the temperature profile of the combined curing/reflow process of the invention is shown. During Time A, the oven is heated to about 150° C. This typically takes about 45 seconds. During this time, while the solder is being heated, any solvents within the solder begin to evaporate. The flux in the solder begins to activate at about 100° C., and the surface mount adhesive begins to cure at about 85° C.

During Time B, the oven is held at 150° C. for between 45–100 seconds so that the flux becomes fully activated and the adhesive used to fix the surface mount device to the circuit board sufficiently cures to hold surface mount device when the solder melts. Consequently, a separate curing device does not have to be used to cure the adhesive.

During Time C, the oven temperature is heated to the melting temperature of the solder. At 183° C., the solder is molten and begin to wet the solder pads of the surface mount device and the circuit board. Once the solder becomes molten, it is very important to have the adhesive sufficiently cured so that the force of the molten solder will not move the surface mount device. At a minimum, adhesive must be substantially cured by time C.

Oven is further heated to 210° C. to fully ensure solder rapidly and completely melts during Time D. During Time E, the solder solidifies as the oven cools.

Referring now to FIG. 4, the adhesive must be sufficiently cured in order to hold the surface mount device to the circuit board. The Loctite brand, Chipbonder 3609® is the basis for the charts of FIGS. 4 and 5. As shown in FIG. 4, the adhesive has a rapid curing rate. A differential scanning calorimeter was used to perform the analysis. The first column is cure time at 150° C. The second column is differential scanning calorimeter cure exotherm which is the amount of energy required to cure the adhesive. The third column is a percentage value of the amount cured. After 30 seconds at 150° C., the adhesive is 90.84% cured. In the second column, the amount of energy required to finish curing is shown to have dropped at the initial state of 284.3 joules per gram to only 35.21 joules per gram. After 60 seconds at 150° C., the adhesive is 92% cured. After 90 seconds the adhesive is over 96% cured. To fully cure, the adhesive was shown to have taken approximately 300 seconds at 150° C. The adhesive actually begins to cure at approximately 85° C., which when referring back to FIG. 3, occurs during Time A, i.e., the ramping to the flux activation temperature.

Referring now to FIG. 5, shows that the adhesive is able to withstand very high applied torque after a short period of time at 150° C. The first column is the cure time. The second column is the torque measurement required to cause bond failure of the adhesive cured at 100° C. The third column is the torque measurement required to cause bond failure of the adhesive cured at 150° C. If the adhesive is cured at 100° C., the adhesive after 60 seconds is only able to withstand 9 Newton mm, after 90 seconds, only 16 Newton mm, after 120 seconds, 26 Newton mm of torque, after 180 seconds, 26 Newton mm, and after 600 seconds, 56 Newton mm. The torque resistance is extremely high after only 60 seconds at 150° C. The torque after 60 seconds is up to 57 Newton mm. The torque required to cause bond failure of the adhesive with further curing essentially remains the same. A torque of 57 Newton mm is more than capable of withstanding the force of the reflowing solder so that the surface mount device does not move during the reflow process. By using the reflow process described above, significant product reject reductions were achieved. These product rejects were lowered mainly in the area of skewed and tombstoned components.

It should be evident to one skilled in the art that various modifications are within the scope of the present invention. One example would be that the processing times will vary according to the use of different materials, such as adhesives, solders, and flux compositions.

What is claimed is:

1. A method for soldering a surface mount device to a circuit board comprising the steps of:

applying solder paste to the circuit board, said solder paste having solder and flux, said flux having a flux activation temperature of about 100°–170° C. and said solder having a solder melting temperature above said flux activation temperature;

applying a rapid heat curable adhesive to the circuit board;

placing a surface mount device on said circuit board contacting said adhesive and said solder paste to form an assembly;

placing the circuit board into an oven;

heating said assembly in said oven along a solder melting profile so that said adhesive substantially cures while said flux is activated but before said solder begins to melt; and cooling said assembly board.

2. A method for soldering a surface mount device to a circuit board as recited in claim 1 wherein said adhesive is amine cured epoxy.

3. A method for soldering a surface mount device to a circuit board as recited in claim 1 wherein said adhesive is a combination of epoxy, anhydride curing agent and an imidazole catalyst.

4. A method of reflow soldering a surface mount device to a circuit board, comprising:

(a) depositing flux and solder onto said circuit board at two or more locations;

(b) depositing a rapid cure adhesive onto said circuit board between said flux and solder joints;

(c) placing a surface mount device onto said deposits to form an assembly;

(d) heating said assembly along a solder reflow melting profile wherein said adhesive is substantially cured while aid flux is thermally activated but before said solder begins to melt; and (e) cooling said assembly.

5. The method as in claim 1 in which, during step (d) the time period for substantially curing said adhesive is less than two months.

* * * * *